United States Patent
Tan et al.

(10) Patent No.: US 9,813,035 B2
(45) Date of Patent: Nov. 7, 2017

(54) GAIN ENHANCEMENT USING ADVANCED CORRELATED LEVEL SHIFTING

(71) Applicant: Analog Devices, Inc., Norwood, MA (US)

(72) Inventors: Zhichao Tan, Wilmington, MA (US); Khiem Quang Nguyen, Tewksbury, MA (US); Xiao Hong Du, Wilmington, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/930,186

(22) Filed: Nov. 2, 2015

(65) Prior Publication Data

US 2017/0126189 A1  May 4, 2017

(51) Int. Cl.
| | |
|---|---|
| *H03F 1/02* | (2006.01) |
| *H03G 1/00* | (2006.01) |
| *H03F 3/00* | (2006.01) |
| *H03F 3/45* | (2006.01) |

(52) U.S. Cl.
CPC ............ *H03G 1/0094* (2013.01); *H03F 3/005* (2013.01); *H03F 3/45479* (2013.01); *H03F 2200/153* (2013.01); *H03F 2203/45156* (2013.01)

(58) Field of Classification Search
CPC ..................................... H03F 1/02; H03F 1/56
USPC .............................................. 330/9; 327/124
See application file for complete search history.

(56) References Cited

U.S. PATENT DOCUMENTS

| | | | |
|---|---|---|---|
| 7,639,073 B2 | 12/2009 | Deng et al. | |
| 7,924,206 B2* | 4/2011 | Sano ................... | G11C 27/026 341/161 |
| 8,400,339 B2 | 3/2013 | Garrity et al. | |
| 9,491,385 B2* | 11/2016 | Tokunaga ............. | H04N 5/374 |

FOREIGN PATENT DOCUMENTS

| | | |
|---|---|---|
| CN | 103905750 A | 7/2014 |
| JP | 2012085133 A | 4/2012 |
| TW | 200812222 A | 3/2008 |
| WO | 2014/059437 A2 | 4/2014 |

OTHER PUBLICATIONS

Hershberg et al., "The Effect of Correlated Level Shifting on Noise Performance in Switched Capacitor Circuits", Circuits and Systems (ISCAS), 2012 IEEE, pp. 942-945.

(Continued)

*Primary Examiner* — Steven J Mottola
(74) *Attorney, Agent, or Firm* — Schwegman Lundberg & Woessner, P.A.

(57) ABSTRACT

Systems and methods disclosed herein provide for enhancing the low frequency (DC) gain of an operational amplifier with multiple correlated level shifting capacitors. In an embodiment, the operational amplifier is level shifted with a first correlated level shifting capacitor in a first phase and, then, is level shifted again with at least a second correlated level shifting capacitor in at least a second, non-overlapping, consecutive phase. In an embodiment, the multiple correlated level capacitors are controlled by a switching circuit network.

18 Claims, 10 Drawing Sheets

(56) References Cited

OTHER PUBLICATIONS

Musah et al., "Correlated Level Shifting Technique With Cross-Coupled Gain-Enhancement Capacitors", Electronics Letters, vol. 45, No. 13, Jun. 18, 2009, pp. 672-674.
Bult et al., "A Fast-Settling CMOS Op Amp for SC Circuits with 90-dB DC Gain", IEEE Journal of Solid-State Circuits, vol. 25, No. 6, Dec. 1990, pp. 1379-1384.
Nagaraj et al., "Switched-Capacitor Circuits with Reduced Sensitivity to Amplifier Gain", IEEE Transactions on Circuits and Systems, vol. CAS-34, No. 5, May 1987, pp. 571-574.
Enz et al., "Circuit Techniques for Reducing the Effects of Op-Amp Imperfections: Autozeroing, Correlated Double Sampling, and Chopper Stabilization", Proceedings of the IEEE, vol. 84, No. 11, Nov. 1996, pp. 1584-1614.
Gregoire et al., "An Over-60 dB True Rail-to-Rail Performance Using Correlated Level Shifting and an Opamp With Only 30 dB Loop Gain", IEEE Journal of Solid-State Circuits, vol. 43, No. 12, Dec. 2008, pp. 2620-2630.
Tabasy et al., "Sequential Correlated Level Shifting: A Switched-Capacitor Approach for High-Accuracy Systems", IEEE Transactions on Circuits and Systems-II: Express Briefs, vol. 60, No. 12, Dec. 2013, pp. 857-861.

\* cited by examiner

GAIN ENHANCEMENT USING ADVANCED CORRELATED LEVEL SHIFTING

FIELD OF THE DISCLOSURE

The present disclosure relates to a system and method for enhancing the low frequency (DC) gain of an operational amplifier (OPAMP) of switched capacitor circuits using multiple correlated level shifting capacitors.

BACKGROUND

An OPAMP is generally utilized in a feedback circuit in order to amplify an input voltage to a desired output voltage. Generally, the OPAMP consists of two input terminals, (i) a positive input terminal (i.e., non-inverting) and (ii) a negative input terminal (i.e., inverting), and an output terminal. Further, in the context of the feedback circuit, a portion of the output is fed back to the inverting terminal to establish a fixed closed-loop gain for the feedback circuit, $G_0$. The feedback gain $G_0$ is the ratio of the voltage across the feedback circuit element, $V_o$, to the voltage across the input circuit element, $V_{in}$. During operation of the feedback circuit, the OPAMP's DC open-loop gain A amplifies the potential difference between the negative and positive inputs of the OPAMP. The open-loop DC gain A of the amplifier will continue to amplify the potential difference between the negative and positive input terminals of the OPAMP until the potential difference is zero. As long as the input and output stay in the operational range of the OPAMP, the output of the OPAMP will be the input voltage multiplied by the closed-loop gain set by the feedback, $G_0$.

However, OPAMPs do not have an infinite DC open-loop gain in real world use. As such, a finite DC open-loop gain A limits the feedback circuit from attaining the ideal feedback gain $G_0$ (i.e., limiting an input voltage from achieving an ideal output voltage). Further, the limited gain A can also introduce error in signal transfer functions, which further limits the performance of the OPAMP. In addition, OPAMPs also have a very narrow output swing range. Therefore, if the output swings beyond the narrow range, the DC open-loop gain of the amplifier A will decrease, which causes the closed-loop gain $G_0$ to decrease as well.

There is thus a need to enhance the DC gain of an OPAMP for circuits with low power consumption.

SUMMARY OF THE DISCLOSURE

In certain embodiments, a switched capacitor circuit includes: an amplifier circuit, wherein the amplifier circuit includes (i) an operational amplifier, (ii) at least one sampling capacitor and (iii) at least one feedback capacitor; a plurality of level shifting capacitors; and a switching circuit network, wherein the switching circuit network (i) includes a plurality of switches and (ii) is configured to selectively connect the plurality of level shifting capacitors to the amplifier circuit in first and at least second, non-overlapping, level shifting phases.

In certain embodiments, a method for operating a switched capacitor circuit is provided, wherein the switch capacitor circuit includes: (i) an amplifier circuit including an operational amplifier, at least one sampling capacitor and at least one feedback capacitor, (ii) a plurality of level shifting capacitors and (iii) a switching circuit network including a plurality of switches, the method discloses selectively connecting, with the switching circuit network, the plurality of level shifting capacitors to the amplifier circuit in first and at least second, non-overlapping, level shifting phases.

In certain embodiments, a switched capacitor circuit includes: means for amplifying an input voltage; means for storing electrical charge; and means for selectively connecting the means for storing electrical charge to the means for amplifying the input voltage in first and at least second, non-overlapping, level shifting phases.

DETAILED DESCRIPTION

The following description of embodiments provides non-limiting representative examples referencing numerals to particularly describe features and teachings of different aspects of the disclosure. The embodiments described should be recognized as capable of implementation separately, or in combination, with other embodiments from the description of the embodiments. A person of ordinary skill in the art reviewing the description of embodiments should be able to learn and understand the different described aspects of the disclosure. The description of embodiments should facilitate understanding of the disclosure to such an extent that other implementations, not specifically covered but within the knowledge of a person of skill in the art having read the description of embodiments, would be understood to be consistent with an application of the disclosure.

Embodiments of the present disclosure provide systems and methods for enhancing the DC gain of an OPAMP of switched capacitor circuits using multiple correlated level shifting capacitors. In an embodiment, the OPAMP is level shifted with a first correlated level shifting capacitor in a first phase and, then, is level shifted again with at least a second correlated level shifting capacitor in at least a second, non-overlapping, consecutive phase. In an embodiment, the multiple correlated level shifting capacitors are controlled by a switching circuit network.

Figure 1:
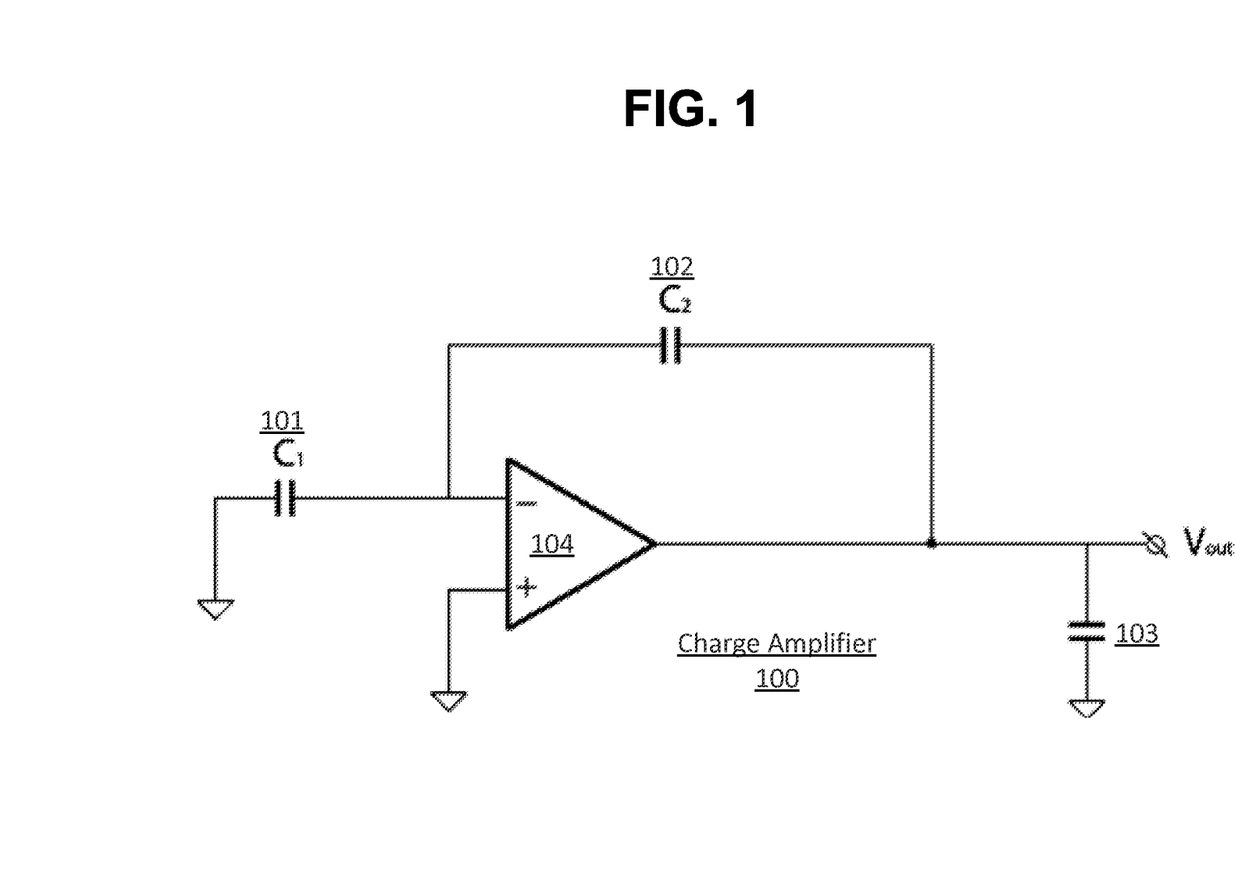
FIG. 1 depicts an embodiment of a conventional charge amplifier during the amplification phase.

FIG. 1 depicts an embodiment of a conventional charge amplifier during the amplification phase. Charge amplifier 100 (i.e., including a feedback component) includes a sampling capacitor 101 (i.e., $C_1$), a feedback capacitor 102 (i.e., $C_2$), load 103 (e.g., a load capacitor) and OPAMP 104. Further, as depicted in FIG. 1, feedback capacitor 102 is connected between the output of OPAMP 104 and the negative input terminal of OPAMP 104. Further, both of the sampling capacitor 101 and the positive input terminal of OPAMP 104 are connected to a ground. In an embodiment, because the charge amplifier 100 of FIG. 1 is in a charge amplification phase, it is assumed that the sampling capacitor 101 is already charged with a previously sampled input voltage (not shown). Further, during an operation of the charge amplifier 100 in the amplification phase, the charge stored on sampling capacitor 101 is transferred to the feedback capacitor 102. Further, during the amplification phase, the open-loop DC gain A of the OPAMP 104 amplifies the potential difference between the positive and negative terminal inputs of the OPAMP 104 until the charge stored on the sampling capacitor 101 is completely transferred to the feedback capacitor 102 (i.e., when the potential difference between the positive and negative terminals is zero). In an embodiment, the output of the OPAMP 104 will be the input voltage multiplied by the closed-loop gain, $G_0$, set by the feedback circuit (i.e., the sampling capacitor 101 and the feedback capacitor 102). Further, the load 103 is charged with the output voltage, $V_{out}$, of OPAMP 104. With regard to charge amplifier 100 of FIG. 1, the closed-loop gain, $G_0$, is $(1/C_2)/(1/C_1)$ or $C_1/C_2$ (i.e., ratio of the voltage across feedback capacitor 102 to the voltage across the sampling capacitor 101). However, because of finite DC open-loop gain A of OPAMP 104, the final closed-loop gain, G, is closer to the following equation (i.e., assuming that OPAMP 104 has infinite bandwidth):

$$G = \frac{G_0}{1 + \frac{1}{A}(1 + G_0)} \quad (1)$$

In an embodiment, due to the finite DC open-loop gain A of OPAMP 104, not all of the charge stored on the sampling capacitor 101 is transferred to the feedback capacitor 102. Accordingly, the potential difference between the positive and negative input terminals of the OPAMP 104 will not reach zero during the amplification phase, and, therefore, the final gain G will be below the ideal gain $G_0$. As such, the output voltage, $V_{out}$, will also fall below an ideal output voltage.

Figure 2A:
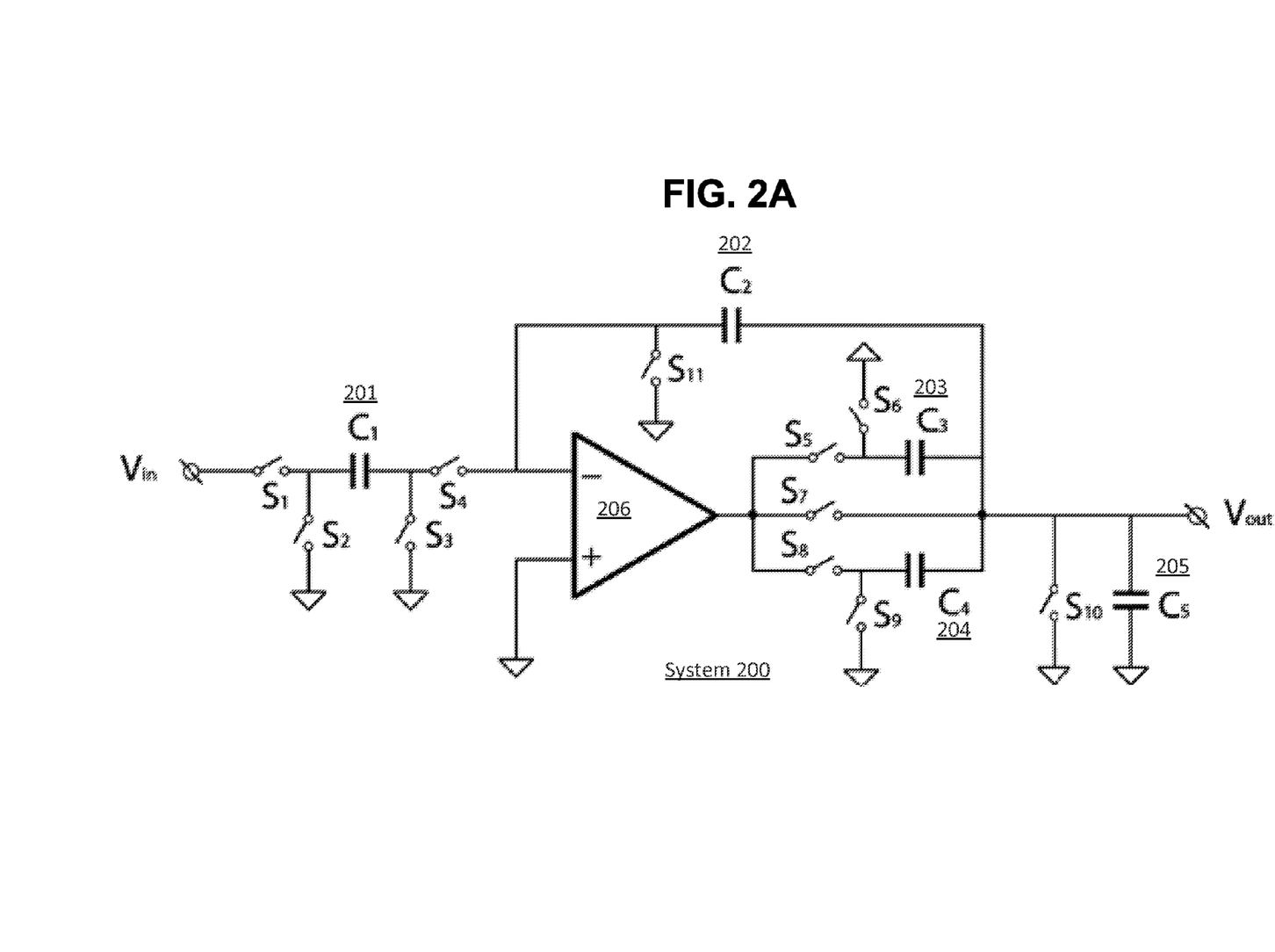
FIG. 2A illustrates an embodiment of a charge amplifier incorporating the multiple correlated level shifting capacitors.

FIG. 2A illustrates an embodiment of a charge amplifier incorporating the multiple correlated level shifting capacitors. System 200 includes a charge amplifier (i.e., including a feedback component) comprised of sampling capacitor 201 (i.e., $C_1$), a feedback capacitor 202 (i.e., $C_2$), first level shifting capacitor 203 (i.e., $C_3$), second level shifting capacitor 204 (i.e., $C_4$), load 205 (e.g., a load capacitor $C_5$) and OPAMP 206. In an embodiment, system 200 can also include additional sampling, feedback and load capacitors. System 200 further includes a switching circuit network comprised of switches $S_1$, $S_2$, $S_3$, $S_4$, $S_5$, $S_6$, $S_7$, $S_8$, $S_9$, $S_{10}$ and $S_{11}$. In an embodiment, a switching circuit network control (not shown) controls the state (i.e., opened or closed) of each of the aforementioned switches. In an embodiment, as depicted in FIG. 2A, switch $S_1$ is positioned between an input voltage node (i.e., to receive an input voltage, $V_{in}$) and a first terminal of the sampling capacitor 201; switch $S_2$ is positioned between the first terminal of the sampling capacitor 201 and a ground; switch $S_3$ is positioned between a second terminal of the sampling capacitor 201 and a ground; switch $S_4$ is positioned between the second terminal of the sampling capacitor 201 and a first input terminal of OPAMP 206; switch $S_5$ is positioned between the output of OPAMP 206 and a first terminal of the first level shifting capacitor 203; switch $S_6$ is positioned between the first terminal of the first level shifting capacitor 203 and a ground; switch $S_7$ is positioned between the output of OPAMP 206 and an output node, $V_{out}$, of the system 200; switch $S_8$ is positioned between the output of OPAMP 206 and a first terminal of the second level shifting capacitor 204; switch $S_9$ is positioned between the first terminal of the second level shifting capacitor 204 and a ground; switch $S_{10}$ is positioned between the output node, $V_{out}$, and a ground; and $S_{11}$ is positioned between a first terminal of the feedback capacitor 202 and a ground. In an embodiment, system 200 can also include further level shifting capacitors. In an embodiment, the additional level shifting capacitor(s) can be positioned in parallel with the first level shifting capacitor 203 and the second level shifting capacitor 204. Accordingly, the additional level shifting capacitor(s) will also be connected to a plurality of switches, e.g., (i) a switch positioned between the output of the OPAMP 206 and a first terminal of the additional level shifting capacitor, and (ii) a switch positioned between the first terminal of the additional level shifting capacitor and a ground.

Further, in an embodiment, the second input terminal of OPAMP 206 is connected to a ground. In an embodiment, the first input terminal of the OPAMP 206 is a negative input terminal, and the second input terminal of the OPAMP 206 is a positive input terminal. In an embodiment, OPAMP 206 can also be utilized in a single-stage amplifier configuration as well as an inverter-based amplifier configuration.

Figure 2B:
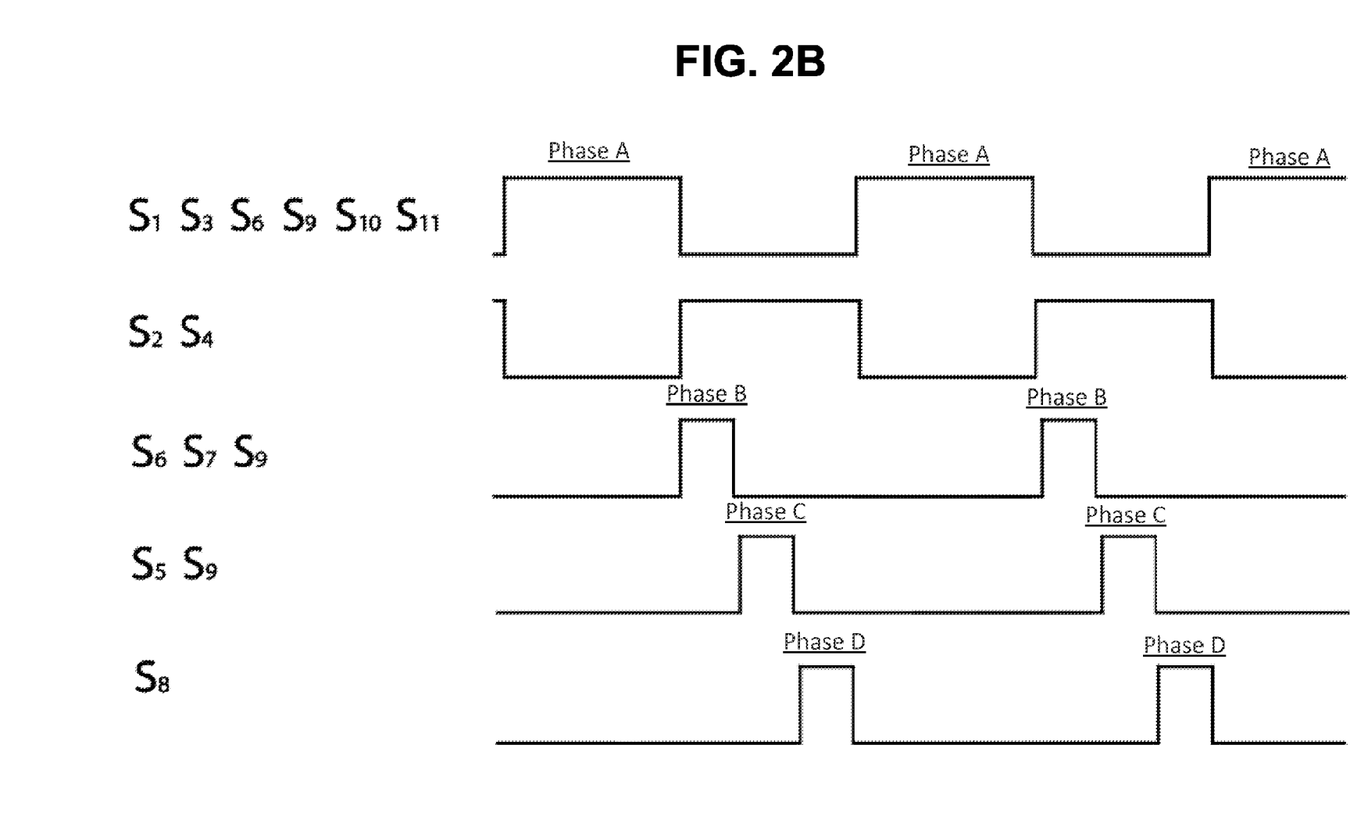
FIG. 2B illustrates a timing diagram of the charge amplifier of FIG. 2A incorporating the multiple correlated level shifting capacitors.

FIG. 2B illustrates a timing diagram of the charge amplifier of FIG. 2A incorporating the multiple correlated level shifting capacitors. Accordingly, the operation of the charge amplifier occurs in four phases: (i) phase A (i.e., the sampling phase), (ii) phase B (i.e., the charging phase), (iii) phase C (i.e., first level shifting phase) and (iv) phase D (i.e., second level shifting phase). In an embodiment, phase A occurs in a first main clock cycle and phases B to D occur in a second main clock cycle. In an embodiment, phases A to D are non-overlapping. In an embodiment, phases B to D are of equal time length. In another embodiment, phases B to D are of varying time lengths. In an embodiment, as depicted in FIG. 2B, the process restarts at phase A at the third main clock cycle. In an embodiment, during phase A (i.e., the sampling phase) switches $S_1$, $S_3$, $S_6$, $S_9$, $S_{10}$ and $S_{11}$ are the only switches closed. At the end of phase A (i.e., the first main clock cycle), switches $S_1$, $S_3$, $S_6$, $S_9$, $S_{10}$ and $S_{11}$ are opened. At the start of the second main clock cycle, switches $S_2$ and $S_4$ are closed for the entirety of the clock cycle. Further, during phase B (i.e., the charging phase) of the second main clock cycle, switches $S_6$, $S_7$ and $S_9$ are also closed. At the end of phase B, switches $S_6$ are $S_7$ are opened. At the start of phase C (i.e., the first level shifting phase), switches $S_5$ is closed and $S_9$ remains closed. At the end of phase C, switches $S_5$ and $S_9$ are opened. At the start of phase D (i.e., the second level shifting phase), switch $S_8$ is closed. At the conclusion of phase D (i.e., the end of the second main clock cycle), $S_2$, $S_4$, and $S_8$ are opened.

Figure 3A:
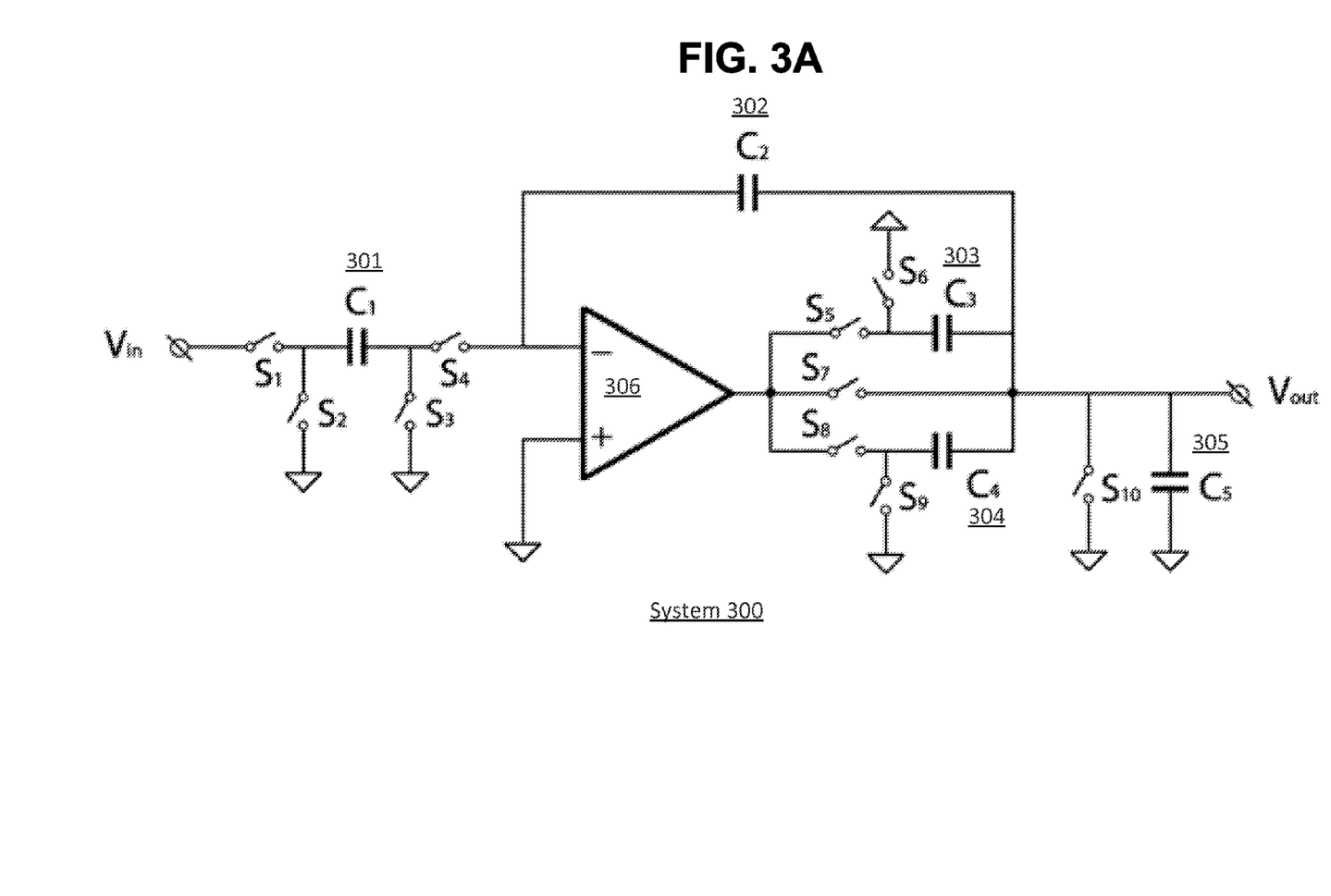
FIG. 3A illustrates an embodiment of an integrator incorporating the multiple correlated level shifting capacitors.

FIG. 3A illustrates an embodiment of an integrator incorporating the multiple correlated level shifting capacitors. The integrator of system 300 includes similar structure and function as the charge amplifier of system 200 in FIG. 2A except that there is no switch $S_{11}$ connected between a first terminal of the feedback capacitor 302 and a ground. Thus, the charge that accumulates at the feedback capacitor 302 over time will not be discharged through a ground.

Figure 3B:
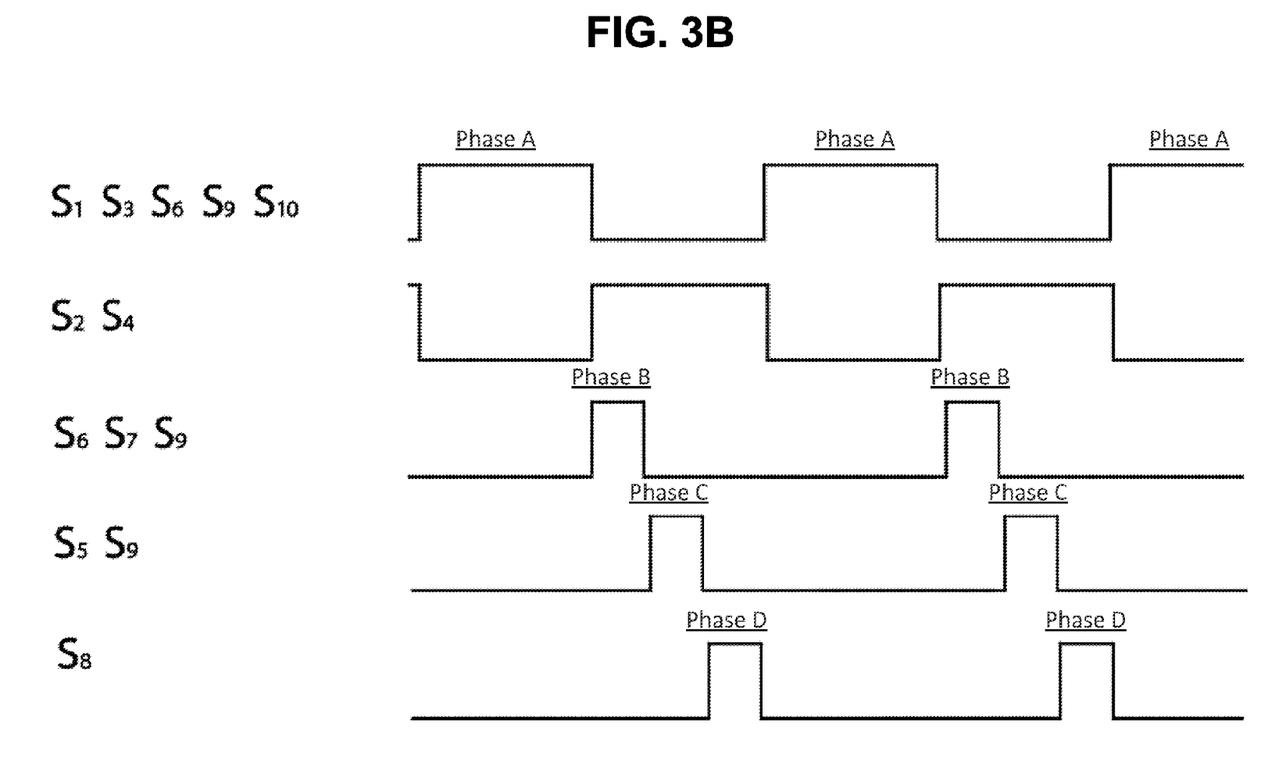
FIG. 3B illustrates a timing diagram of the integrator of FIG. 3A incorporating the multiple correlated level shifting capacitors.

FIG. 3B illustrates a timing diagram of the integrator of FIG. 3A incorporating the multiple correlated level shifting capacitors. The timing diagram of FIG. 3B is similar to the timing diagram of FIG. 3B except that switch $S_{11}$ is not included. Accordingly, contrary to the feedback capacitor 202 of the charge amplifier in FIG. 2A, the feedback capacitor 302 of the integrator in FIG. 3A is not reset at the start of each new sampling phase A. Therefore, the feedback capacitor 302 will continue to accumulate additional charge.

Figure 4A:
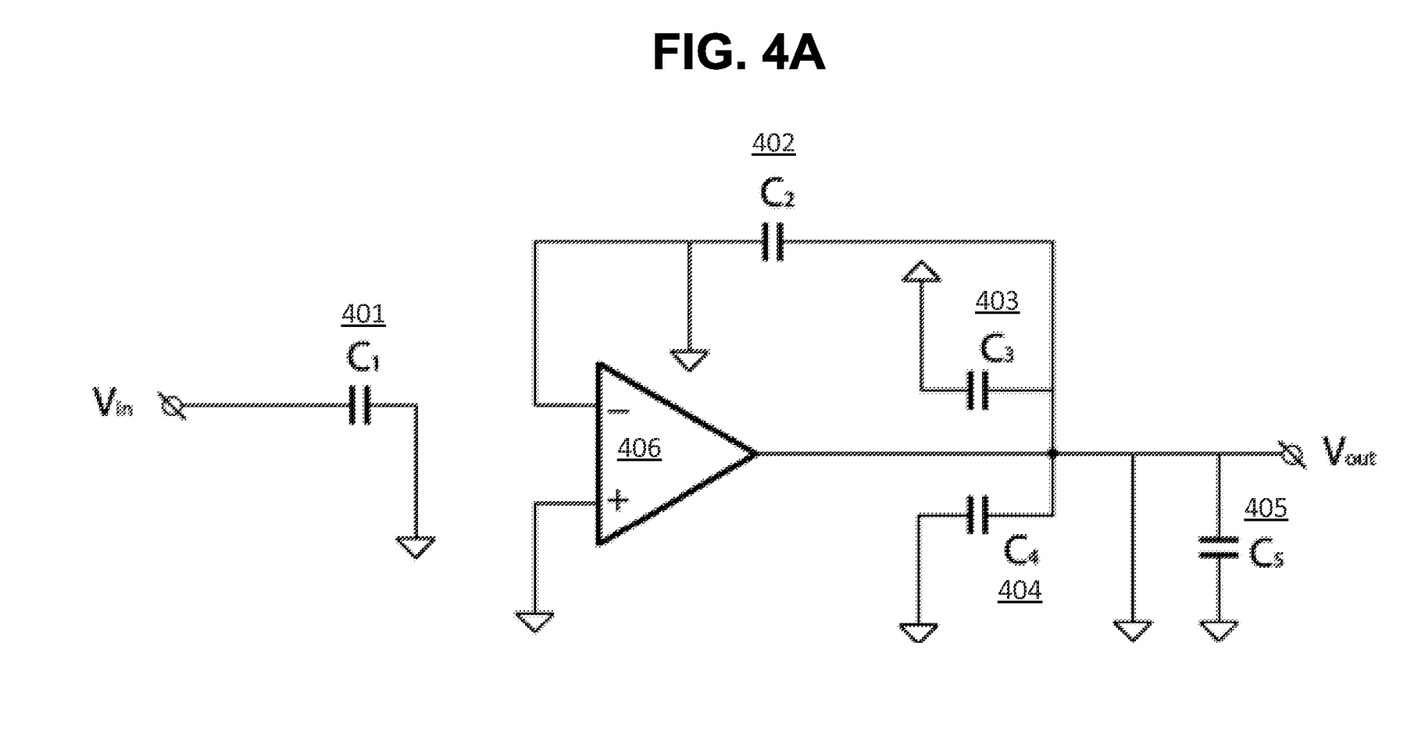
FIG. 4A illustrates the charge amplifier of FIG. 2A during a sampling phase.

FIG. 4A illustrates the charge amplifier of FIG. 2A during a sampling phase. In an embodiment, during the sampling phase, the input voltage $V_{in}$, is sampled at sampling capacitor 401 (i.e., capacitor 401 is charged). Further, in an embodiment, during the sampling phase, a feedback capacitor 402, a first level shifting capacitor 403, a second level shifting capacitor 404 and a load 405 (e.g., a load capacitor) are all reset. In other words, any charge left on those capacitors is drained through a ground.

Figure 4B:
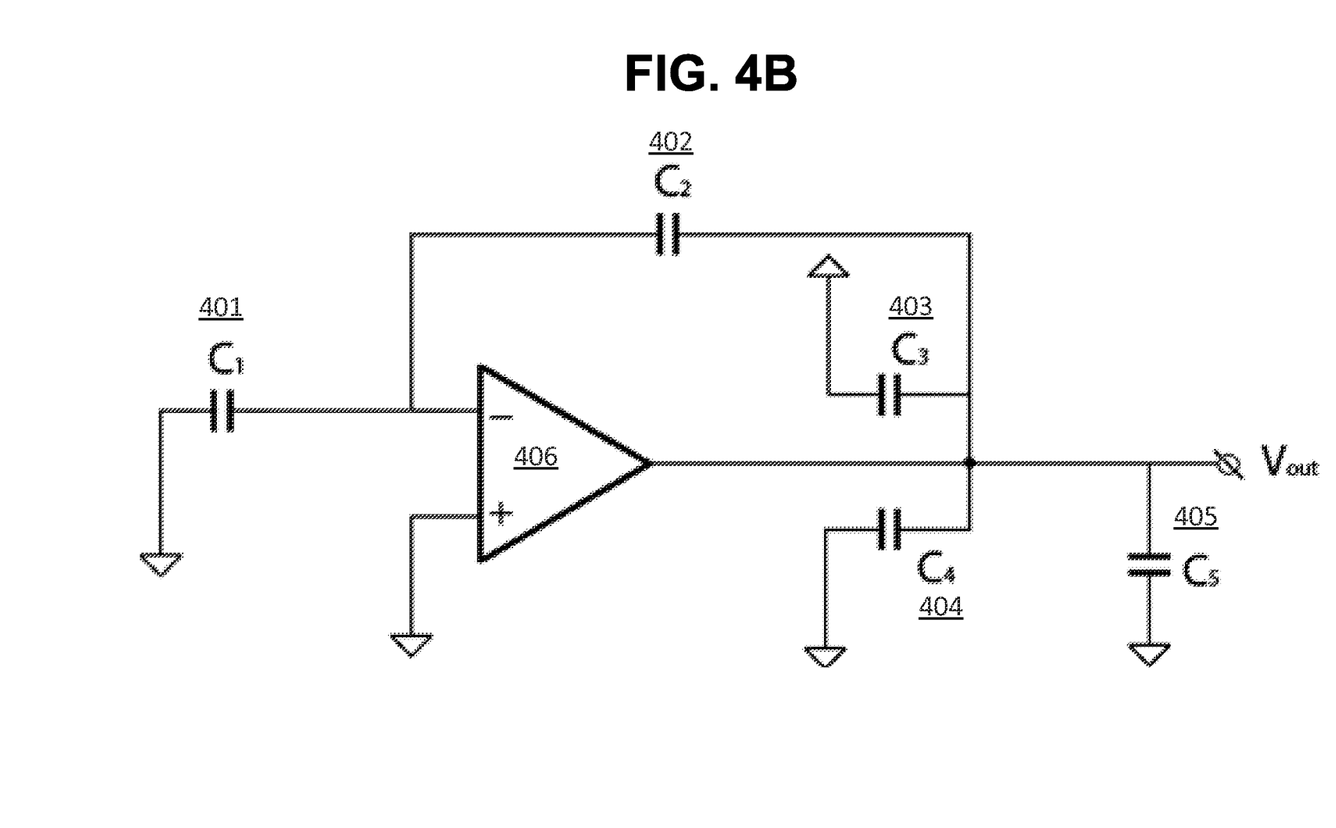
FIG. 4B illustrates the charge amplifier of FIG. 2A during a charging phase.

FIG. 4B illustrates the charge amplifier of FIG. 2A during a charging phase. In an embodiment, during the charging phase, the sampling capacitor 401 transfers its charge to feedback capacitor 402 and OPAMP 406 charges the first level shifting capacitor 403, the second level shifting capacitor 404 and load capacitor 405. In an embodiment, after a certain settling time, the charging of the first level shifting capacitor 403, the second level shifting capacitor 404 and load 405 completes and the voltage (i.e., potential difference) across the aforementioned capacitors will settle on an output voltage, $V_{out}$. However, due to the limited DC gain of OPAMP 406, the sampling capacitor 401 does not transfer its whole charge to the feedback capacitor 402 via the positive terminal of the OPAMP 406 (i.e., the summing node). Therefore, there will still be some residual charge at the summing node; resulting in a nonzero potential difference between the positive and negative input terminals of the OPAMP 406. Accordingly, the closed-loop gain of the feedback circuit of the charge amplifier has to be determined by the formula in equation 1. Further, the output voltage, $V_{out}$, across capacitors 403, 404 and 405 will be somewhere below the ideal voltage.

Figure 4C:
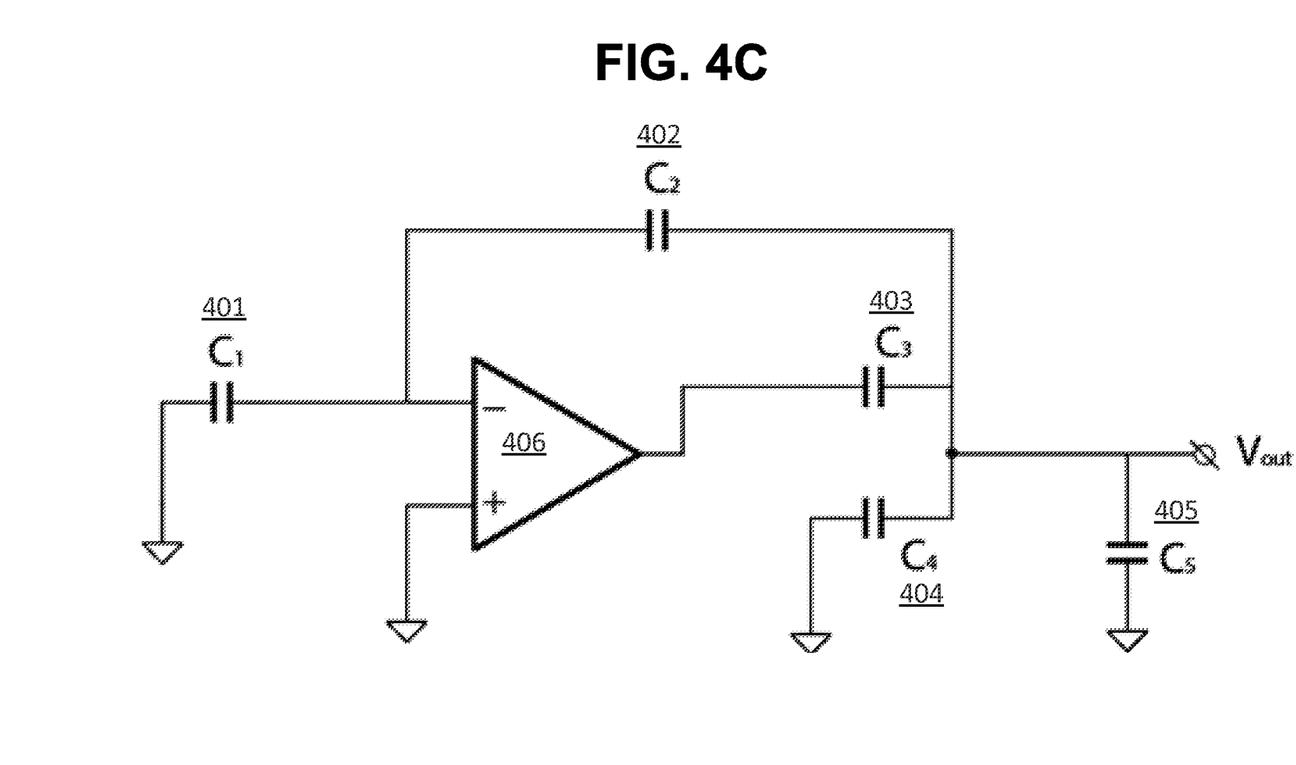
FIG. 4C illustrates the charge amplifier of FIG. 2A during the first level shift phase.

FIG. 4C illustrates the charge amplifier of FIG. 2A during the first level shift phase. In an embodiment, during the first level shift phase, a first terminal of the first level shifting capacitor 403 is connected to the output of the OPAMP 406. Accordingly, because the first level shifting capacitor 403 has a potential difference of $V_{out}$, connecting the first level shifting capacitor 403 to the output of the OPAMP 406 forces the output voltage of the OPAMP 406 to near zero (i.e., the potential difference between the output of the OPAMP 406, $V_{out}$, and the voltage across the first level shifting capacitor 403, which is also $V_{out}$, is zero). In other words, the first level shifting capacitor 403 removes the burden of generating $V_{out}$ from the OPAMP 406. Accordingly, since the voltage at the summing node (i.e., positive terminal of the OPAMP 406) is defined by following equation:

$$V_{sum} = \frac{V_{out}}{A}, \qquad (2)$$

as the output voltage $V_{out}$ of the OPAMP 406 decreases, so does the voltage, $V_{sum}$, at the summing node (i.e., bringing the voltage at the summing node closer to virtual ground). Further, as the voltage at the summing node decreases, more charge will transfer from the sampling capacitor 401 to the feedback capacitor 402. Further, the potential difference between the positive and negative input terminals of the OPAMP 406 will get much closer to zero, effectively resulting in (i) a virtual increase in the DC open-loop gain A of OPAMP 406 and (ii) an increase in the generated output voltage, $V_{out}$, of the OPAMP 406 (i.e., bringing the output voltage closer to its ideal value). In an embodiment, as $V_{out}$ approaches the more ideal voltage, the voltage across the second level shifting capacitor 404 and the load capacitor 405 will also increase (i.e., getting closer to the ideal output voltage). Specifically, in an embodiment, as charge is transferred from the sampling capacitor 401 to the feedback capacitor 402, a small amount of charge is also discharged from the first level shifting capacitor 403. In an embodiment, the aforementioned discharged charge from the first level shifting capacitor 403 is transferred to the second level shifting capacitor 404 and the load capacitor 405, thereby increasing the voltage across the second level shifting capacitor 404 and the load capacitor 405. Accordingly, the charge in the second level shifting capacitor 404 and the load capacitor 405 at the end of the first level shifting phase in FIG. 4C is greater than the charge in the second level shifting capacitor 404 and the load capacitor 405 at the end of the charging phase in FIG. 4B.

Figure 4D:
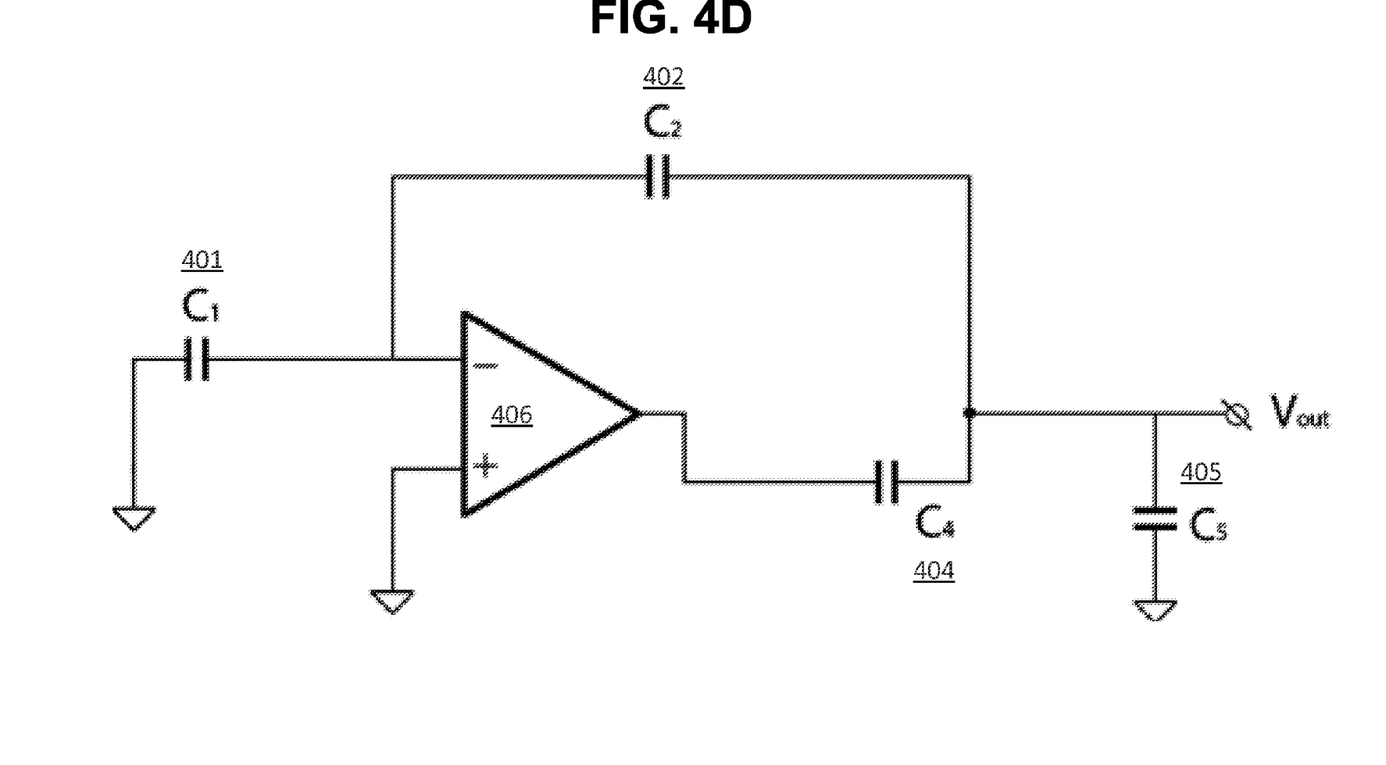
FIG. 4D illustrates the charge amplifier of FIG. 2A during the second level shift phase.

FIG. 4D illustrates the charge amplifier of FIG. 2A during the second level shift phase. In an embodiment, during the second level shifting phase, (i) the first terminal of the first level shifting capacitor 403 is disconnected from the output of the OPAMP 406 and (ii) the first terminal of the second level shifting capacitor 404 is connected to the output of the OPAMP 406 instead. In an embodiment, similar to the first level shifting phase, because the second level shifting capacitor 404 has a potential difference of $V_{out}$ (i.e., increased after the first level shifting phase), connecting the second level shifting capacitor 404 to the output of the OPAMP 406 forces the output voltage of the OPAMP 406 closer to near zero. Thus, as previously explained, the voltage, $V_{sum}$, at the summing node will decrease as the output voltage $V_{out}$ of the OPAMP 406 decreases. Further, as the voltage at the summing node decreases, more charge will transfer from the sampling capacitor 401 to the feedback capacitor 402. Further, the potential difference between the positive and negative input terminals of the OPAMP 406 will also get much closer to zero. Accordingly, (i) there will be a virtual increase in the DC open-loop gain A of OPAMP 406 and (ii) the generated output voltage, $V_{out}$, of the OPAMP 406 get closer to its ideal value. Therefore, the voltage across the load capacitor 405 will also increase and, thus, get closer to the ideal output voltage. Accordingly, with the second, non-overlapping, consecutive level shifting phase, the DC open-loop gain A of OPAMP 406 is enhanced much further than possible with only the single level shifting phase.

In an embodiment, the integrator of FIG. 3A essentially follows the level-shifting process as the charging amplifier (i.e., FIGS. 4A-4D) except that, during the sampling phase (i.e., FIG. 4A), the feedback capacitor 402 is not reset. In other words, the charge left on the feedback capacitor 402 after the previous level shifting process is not drained through a ground.

Figure 5:
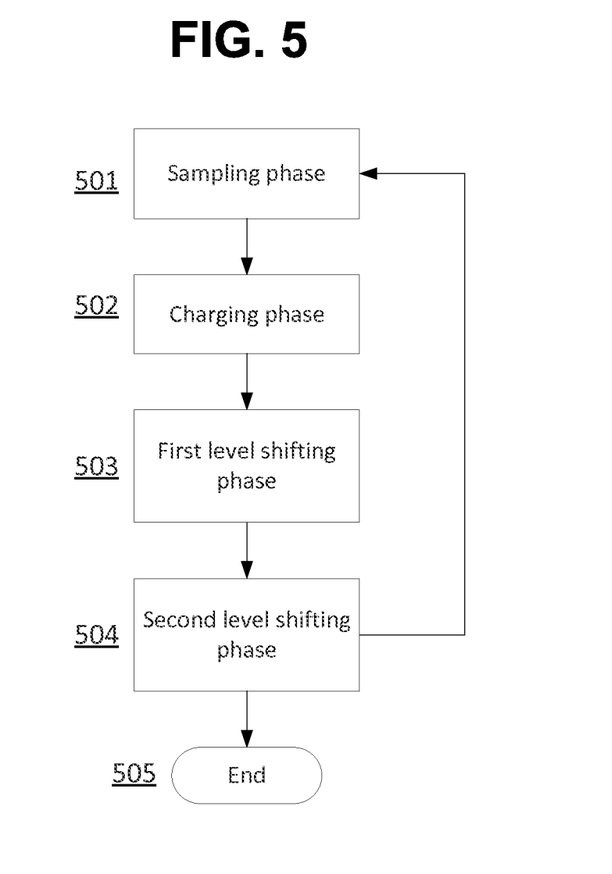
FIG. 5 illustrates an embodiment of a method utilizing the multiple correlated level shifting capacitors.

FIG. 5 illustrates an embodiment of a method utilizing the multiple correlated level shifting capacitors. In an embodiment, during the sampling phase 501, (i) the feedback capacitor, first level shifting capacitor, second level shifting capacitor, and load capacitor of an amplifier circuit are reset and (ii) the sampling capacitor samples an input voltage. Then, during the charging phase 502, (i) the sampling capacitor transfers most (e.g., a majority) of its charge to the feedback capacitor and (ii) the OPAMP charges the first level shifting capacitor, the second level shifting capacitor and the load capacitor. Then, during the first level shifting phase 503, the first level shifting capacitor is connected (e.g., inserted) between the output of the OPAMP and the output node of the amplifier circuit. Then, during the second level shifting phase, (i) the first level shifting capacitor is disconnected and (ii) the second level shifting capacitor is connected (e.g., inserted) between the output of the OPAMP and the output node of the amplifier circuit. In an embodiment, the method can either proceed back to the sampling phase 501 (i.e., in order to sample another input voltage of a signal) or conclude at step 505. In an embodiment, the amplifier can be a charge amplifier or an integrator. In an embodiment, the integrator will essentially follow the aforementioned method except that, during the sampling phase 501, the feedback capacitor will not be reset.

Several embodiments of the disclosure are specifically illustrated and/or described herein. However, it will be appreciated that modifications and variations of the disclosure are covered by the above teachings and within the purview of the appended claims without departing from the spirit and intended scope of the disclosure. Further variations are permissible that are consistent with the principles described above.

What is claimed is:

1. A method for operating a switched capacitor circuit, wherein the switched capacitor circuit comprises (i) an amplifier circuit including an operational amplifier, at least one sampling capacitor, and at least one feedback capacitor, (ii) a plurality of level shifting capacitors and (iii) a switching circuit network including a plurality of switches, the method comprising:
    selectively connecting, with the switching circuit network, the plurality of level shifting capacitors to the amplifier circuit in first and at least second, non-overlapping, level shifting phases;
    controlling, through the switching circuit network, the amplifier circuit and the plurality of level shifting capacitors in a sampling phase and a non-overlapping, charging phase;
    during the sampling phase, (i) the sampling capacitor samples an input voltage and (ii) the plurality of level shifting capacitors are reset; and
    wherein, during the charging phase, (i) the sampling capacitor transfers a majority of its sampled charge to the feedback capacitor and (ii) the operational amplifier charges the plurality of level shifting capacitors.

2. The method of claim 1, wherein the sampling phase, the charging phase, the first level shifting phase, and the second level shifting phase are consecutive, non-overlapping phases.

3. The method of claim 2, wherein (i) the sampling phase occurs within a first main clock cycle and (ii) the charging phase, the first level shifting phase, and the second level shifting phase all occur within a second main clock cycle.

4. The method of claim 3, wherein the charging phase, the first level shifting phase, and the second level shifting phase are of varying time lengths.

5. A switched capacitor circuit, comprising:
    means for amplifying an input voltage;
    means for storing electrical charge; and
    means for selectively connecting the means for storing electrical charge to the means for amplifying the input voltage in first and at least second, non-overlapping, level shifting phases;
    means for controlling the means for amplifying the input voltage and the means for storing electrical charge in a sampling phase and a non-overlapping, charging phase;
    wherein, during the sampling phase, (i) a sampling capacitor of the means for amplifying the input voltage samples an input voltage and (ii) the means for storing electrical charge are reset; and
    wherein, during the charging phase, (i) the sampling capacitor transfers a majority of its sampled charge to a feedback capacitor of the means for amplifying the input voltage and (ii) the operational amplifier charges the means for storing electrical charge.

6. The switched capacitor circuit of claim 5, wherein during the first level shifting phase, a first means for storing electrical charge is connected between an output of an operational amplifier of the means for amplifying the input voltage and an output node of the means for amplifying the input voltage, and
    wherein, during a second level shifting phase, (i) the first means for storing electrical charge is disconnected from the output of the operational amplifier and (ii) a second means for storing electrical charge is connected between the output of the operational amplifier and the output node of the means for amplifying the input voltage.

7. The switched capacitor circuit of claim 5, wherein (i) the sampling phase occurs within a first main clock cycle and (ii) the charging phase, the first level shifting phase, and the second level shifting phase all occur within a second main clock cycle.

8. The switched capacitor circuit of claim 5, wherein the charging phase, the first level shifting phase, and the second level shifting phase are of varying time lengths.

9. The switched capacitor circuit of claim 5, wherein the charging phase, the first level shifting phase, and the second level shifting phase are of substantially equal time lengths.

10. A switched capacitor circuit, comprising:
    an amplifier circuit for amplifying an input voltage;
    level shifting capacitors for storing electrical charge; and
    a switching circuit network for selectively connecting the level shifting capacitors to the amplifier circuit in first and at least second, non-overlapping, level shifting phases;
    control signal inputs for controlling the amplifier circuit and the level shifting capacitors in a sampling phase and a non-overlapping, charging phase;
    wherein, during the sampling phase, (i) a sampling capacitor is configured to sample an input voltage and (ii) the level shifting capacitors are reset; and
    wherein, during the charging phase, (i) the sampling capacitor transfers a portion of its sampled charge to a feedback capacitor and (ii) the amplifier circuit charges the level shifting capacitors.

11. The switched capacitor circuit of claim 10, wherein during the first level shifting phase, a first level shifting capacitor is connected between an output of an operational amplifier and an output node of the amplifier circuit, and
    wherein, during the second level shifting phase, (i) the first level shifting capacitor is disconnected from the output of the operational amplifier, and (ii) a second level shifting capacitor is connected between the output of the operational amplifier and the output node of the amplifier circuit.

12. The switched capacitor circuit of claim 10, wherein, during the charging phase, the sampling capacitor transfers a majority of its sampled charge to the feedback capacitor.

13. The switched capacitor circuit of claim 5, wherein (i) the sampling phase occurs within a first main clock cycle and (ii) the charging phase, the first level shifting phase, and the second level shifting phase all occur within a second main clock cycle.

14. The switched capacitor circuit of claim 5, wherein the charging phase, the first level shifting phase, and the second level shifting phase are of varying time lengths.

15. The switched capacitor circuit of claim 5, wherein the charging phase, the first level shifting phase, and the second level shifting phase are of substantially equal time lengths.

16. The method of claim 1, further comprising connecting a first level shifting capacitor of the plurality of level shifting capacitors between an output of the operational amplifier and an output node of the amplifier circuit during the first level shifting phase.

17. The method of claim 1, further comprising during the second level shifting phase, (i) disconnecting a first level shifting capacitor of the plurality of level shifting capacitors from the output of the operational amplifier and (ii) connecting a second level shifting capacitor of the plurality of level shifting capacitors between the output of the operational amplifier and the output node of the amplifier circuit.

18. The method of claim 3, wherein the charging phase, the first level shifting phase, and the second level shifting phase are of substantially equal time lengths.

* * * * *